US006593685B2

(12) United States Patent
Kim

(10) Patent No.: US 6,593,685 B2
(45) Date of Patent: Jul. 15, 2003

(54) COLOR CATHODE RAY TUBE

(75) Inventor: Yong Kun Kim, Kyongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 303 days.

(21) Appl. No.: 09/754,068

(22) Filed: Jan. 5, 2001

(65) Prior Publication Data

US 2001/0007407 A1 Jul. 12, 2001

(30) Foreign Application Priority Data

Jan. 6, 2000 (KR) ........................................... 2000-412

(51) Int. Cl.[7] ............................................... H01L 31/00
(52) U.S. Cl. ........................ 313/407; 313/364; 313/402
(58) Field of Search ................................ 313/364, 402, 313/403, 407, 408, 461, 474, 476

(56) References Cited

U.S. PATENT DOCUMENTS 4,554,440 A 11/1985 Lee, Jr. ...................... 219/501
5,929,558 A * 7/1999 Lee ............................ 313/402
6,133,686 A * 10/2000 Inoue et al. ............ 313/477 R
6,160,344 A * 12/2000 Cho et al. ............... 313/477 R
6,232,712 B1 * 5/2001 Pyun et al. ............. 313/477 R
6,274,977 B1 * 8/2001 Pyun et al. ............. 313/477 R
6,278,232 B1 * 8/2001 Nose et al. ................. 313/407
6,407,496 B2 * 6/2002 Pyun et al. ............. 313/477 R
2001/0052749 A1 * 12/2001 Pyun et al. ................. 313/461
2002/0105257 A1 * 8/2002 Pyun et al. ................. 313/408

* cited by examiner

*Primary Examiner*—Eric S. McCall
(74) *Attorney, Agent, or Firm*—Fleshner & Kim LLP

(57) ABSTRACT

Color cathode ray tube including a panel in front portion of the cathode ray tube, and a shadow mask spaced from, and fitted to rear of the panel for selecting a color from electron beams, wherein at least one of an inside surface of the panel and the shadow mask have a curvature structure in which a radius of curvature varies continuously within a fixed ratio range, thereby enhancing a strength and improving howling.

30 Claims, 11 Drawing Sheets

COLOR CATHODE RAY TUBE

BACKGROUND OF THE INVENTION

1. Field of the Invention

The present invention relates to a color cathode ray tube, and more particularly, to a panel and shadow mask of a color cathode ray tube having a curvature and a radius of curvature for forming a screen.

2. Background of the Related Art

The cathode ray tube is an important component of a display, such as a TV receiver or a computer monitor, for displaying an image. FIG. 1 illustrates a side view of such a color cathode ray tube, with a partial cut away view.

Referring to FIG. 1, there is a panel 1 having an inside surface a fluorescent film 2 is formed thereon in a front portion of the color cathode, and a funnel 3 welded to a rear of the panel 1 with frit glass. There is a shadow mask 6 fitted close to an inside of the panel 1 in a state the shadow mask 6 is fixed to a frame 7 for selection of colors of electron beams emitted from an electron gun 4, and an electron gun 4 provided inside of a neck portion 3*a* of the funnel 3. The frame 7 is fastened to the panel 1 as the frame is hung from a sidewall of the panel 1 by support springs 8 fixed to the frame 7 and inserted in stud pins 9 fixed to the sidewall of the panel 1. There is an inner shield 10 fastened to one side of the frame 7 by fastening springs 11 for protecting the electron beams 5 moving toward the fluorescent film 2 from an external geomagnetism. There is a deflection yoke 13 having a plurality of poles attached to an outer circumference of the neck portion 3*a* for correcting a path of travel of the electron beams 5 so that the electron beams 5 hit onto a required fluorescent material exactly, and a reinforcing band 12 strapped around an outer circumference of the cathode ray tube for preventing breakage of the cathode ray tube from an external impact during operation of the cathode ray tube. Within the foregoing basic structure of the cathode ray tube, the shadow mask 6 is formed to have a curvature, and disposed to have a gap to the panel 1, to form a panel assembly together with the panel, for reproducing a picture as the three electron beams 5 emitted from the electron gun 4 hit the fluorescent material on an inside surface of the panel 1, exactly. Therefore, in order to form the picture, an accurate curvature design of the shadow mask 6 is required, when a panel inside surface curvature and a grouping rate are taken into consideration as curvature design condition.

FIG. 2 illustrates a longitudinal section of a panel assembly, referring to which the panel inside surface curvature and the grouping rate will be explained in more detail.

When Rp denotes an inside surface radius of curvature of the panel 1, and Rm denotes a radius of curvature of the shadow mask 6, basically the radius of curvature Rm of the shadow mask 6 is set to have a fixed ratio to the inside surface radius of curvature Rp of the panel 1. According to this, once the inside surface radius Rp of curvature of the panel 1 is given, the radius Rm of curvature of the mask 6 is dependent on the inside surface radius Rp of curvature of the panel. Along with such a linear dependency on the panel inside surface radius of curvature, the shadow mask 6 is designed, taking a Grouping Rate(G/R), a configuration of the electron beams which fixes a color purity of the picture, into consideration, which can be expressed as an equation, below.

$$G/R = \frac{3 \times S \times Q}{Ph \times L},$$

where,

S: a distance between a deflection center and an electron beam center

Q: a distance between a slot in a shadow mask to an inside surface of the panel

Ph: a distance between centers of slots in the shadow mask

L: a distance from a center of deflection of the electron beam to an inside surface of the panel.

In general, the G/R is set to be G/R=1.000, so that the electron beams exactly hit a required fluorescent material throughout an effective surface of the shadow mask 6, for enhancing the color purity. Thus, in general the curvature and the radius Rm of curvature of the shadow mask 6 is designed to be dependent on the inside surface curvature of the panel basically, and to maintain the G/R constant for securing a color purity.

In the meantime, recently the inside surface radius Rp of curvature of the panel is increased since a wedge ratio, a ratio of a center thickness to a corner thickness of the panel, is limited to a certain range owing to a limitation in formation while an outer surface of the panel 1 is planarized for providing a flat picture, with a consequential increase of the radius of curvature of the shadow mask 6. Since such a shadow mask 6 is weak in strength, the shadow mask 6 is susceptible to deformation caused by an external physical force during handling the shadow mask 6, or howling caused by an impact or a speaker sound during operation of the cathode ray tube. The howling, dependent on vibration characteristics of the shadow mask, occurs when external acoustic wave or vibration is reached to the shadow mask 6, which deteriorates a color reproducibility, to change picture colors in a screen, partly. The shadow mask of the related art panel is compared to the shadow mask of the present invention, such that an extent of deterioration of the howling characteristics is more serious than the deterioration of strength of the shadow mask.

For solving such problems, various methods are employed, which can be summarized as follows.

First, a rigidity of the frame 7 itself is enhanced either by changing a form of the springs 11 which support the frame 7, or by providing a curve to the frame 7. However, since this change to the frame 7 is not improvement to the shadow mask 6 itself which affects the howling the most sensitively and directly, this change can not be any fundamental solution. Moreover, the improvement to the spring 11 and the frame 7 form are not effective to the flat cathode ray tube.

Second, as shown in FIG. 3, a bead 14 having a curvature different from an overall curvature is applied within the effective surface of the shadow mask 6. However, since the bead 14 is within the effective surface, the bead 14 causes difficulty in coating the fluorescent material on the inside surface of the panel 1 in fabrication of the cathode ray tube and a local non-uniformity of the fluorescent surface, that, not only gives inconvenience in view, but also deforms the picture. By the way, the bead 14 in the effective surface enhances a strength of the shadow mask 6 relatively, but shows a limitation in improvement of the howling.

Fourth, as shown in FIG. 4, the shadow mask 6 is pre-tensioned in fitting to the frame 7, and slightly pre-tensioned wire dampers 15 are strapped on the shadow mask 6. However, this method has difficulty in that there should be no deformation in fitting the pre-tensioned shadow mask 6 to the frame 7, and the damper wire 15 should be strapped to exert a uniform pressure throughout the pre-tensioned shadow mask 6, that makes a fabrication process complicate, with an increased production cost.

Alike the bead 14 application, though the damper wire 15 application is favorable in view of strength of the shadow mask 6, the applications have a certain limit in a vibration attenuation.

As shown, because the related art methods in which separate structural bodies are used can not solve the problems, improvements to the panel or shadow mask itself are required. That is, either a method for improving a curvature of the inside surface of the panel, which fixes the curvature of the shadow mask, or separate from this, a method for designing a curvature of the shadow mask itself separate from the curvature of the inside surface of the panel is required.

SUMMARY OF THE INVENTION

Accordingly, the present invention is directed to a color cathode ray tube that substantially obviates one or more of the problems due to limitations and disadvantages of the related art.

An object of the present invention is to provide a color cathode ray tube which can prevent deterioration of a color reproducibility caused by an impact or speaker sound during operation of the cathode ray tube owing to improvement of the howling characteristics.

An object of the present invention is to provide a color cathode ray tube which has an improved structural strength for preventing deformation caused by an external force.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the color cathode ray tube includes a panel in front portion of the cathode ray tube, and a shadow mask spaced from, and fitted to rear of the panel for selecting a color from electron beams, wherein at least one of an inside surface of the panel and the shadow mask have a curvature structure in which a radius of curvature varies continuously within a fixed ratio range.

The variation of radius of curvature of the inside surface of the panel satisfies the following equation.

$$Rpi<Rpi-1\ (i=1, \ldots, n)$$

$$Rpi > \frac{Rpn - Rp0}{Lpn} Lpi + Rp0, \text{ (when } i \neq n \text{ or } 0),$$

if i=n, Rpi=Rpn, and if i=0, Rpi=Rp0, where,

- Rp0 denotes a radius of curvature at a center of the inside surface of the panel,
- Rpi denotes a radius of curvature at any location on the inside surface of the panel,
- Rpn denotes a radius of curvature at an end of effective surface on the inside surface of the panel,
- Lpi denotes a distance from a center of the inside surface of the panel to any location on the inside surface of the panel, and
- Lpn denotes a distance from a center of the inside surface of the panel to an end of an effective surface, and
- the variation of radius of curvature of the shadow mask satisfies the following equation.

$$Rmi<Rmi-1\ (i=1, \ldots, n)$$

$$Rmi > \frac{Rmn - Rm0}{Lmn} Lmi + Rm0, \text{ (when } i \neq n \text{ or } 0),$$

if i=n, Rmi=Rmn, and if i=0, Rmi=Rm0, where,

- Rm0 denotes a radius of curvature at a center of the shadow mask,
- Rmi denotes a radius of curvature at any location on the shadow mask,
- Rmn denotes a radius of curvature at an end of effective surface on the shadow mask,
- Lmi denotes a distance from a center of the shadow mask to any location on the shadow mask, and
- Lmn denotes a distance from a center of the shadow mask to an end of an effective surface.

The curvature structures of the inside surface of the panel and the shadow mask can be expressed as $Rpi=\gamma_p(Lpi)Rp0$ and $Rmi=\gamma_m(Lmi)Rm0$ respectively, where the $\gamma_p$ and $\gamma_m$ denote functions dependent on distances Lpi and Lmi respectively, and the proportional functions $\gamma_p$(Lpi) and $\gamma_m$(Lmi) are continuously decreasing functions with respect to variables Tpi and Tmi which are proportional to the distances Lpi and Lmi according to coefficients $\alpha_p$ and $\alpha_m$ to establish the following equations, respectively.

$$\gamma_p(Lpi)=\cos(Tpi),\ (Tpi=\alpha_p Lpi),\ \gamma_p(Lpi)=\cos(\alpha_p Lpi), \text{ and } \gamma_m(Lmi)=\cos(Tmi),\ (Tmi=\alpha_m Lmi),\ \gamma_m(Lmi)=\cos(\alpha_m Lmi).$$

The curvature structures are formed up to points $L_{p80\%}$ and $L_{m80\%}$ 80% of distances from the centers of the inside surface of the panel and the shadow mask to the ends of the effective surfaces respectively, for improving howling.

The proportional functions $\gamma_p$ and $\alpha_m$ have values in ranges of 0.75~0.97 and 0.65~0.97 at the 80% points $L_{p80\%}$ and $L_{m80\%}$ respectively, and the coefficients $\alpha_p$ and $\gamma_m$ have values expressed by the following inequalities depending on ranges of values of the proportional functions $\gamma_p$ and $\gamma_m$ at the 80% points $L_{p80\%}$ and $L_{m80\%}$ respectively.

$$\frac{\cos^{-1}(0.97)}{L_{m80\%}} <= \alpha_m <= \frac{\cos^{-1}(0.75)}{L_{m80\%}}$$

$$\frac{\cos^{-1}(0.97)}{L_{p80\%}} <= \alpha_p <= \frac{\cos^{-1}(0.75)}{L_{p80\%}}$$

Preferably, the curvature structures are true in at least one of a long axis (X-axis), a short axis (Y-axis), and a diagonal axis (D-axis) respectively, and more preferably in all of a long axis (X-axis), a short axis (Y-axis), and a diagonal axis (D-axis). Additionally, it is more preferable that the curvature structures are true in all directions contained between the long axis (X-axis), the short axis (Y-axis), and the diagonal axis (D-axis).

The foregoing curvature structure is applicable to the inside surface of the panel of a color cathode ray tube of the present invention, and, separate from it, also applicable to a shadow mask independently. Or the curvature structure is applicable both to the inside surface of the panel and the shadow mask.

The present invention enhances a strength, and improves howling of the shadow mask, to minimize deformation of the shadow mask and prevent deterioration of the color reproducibility.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
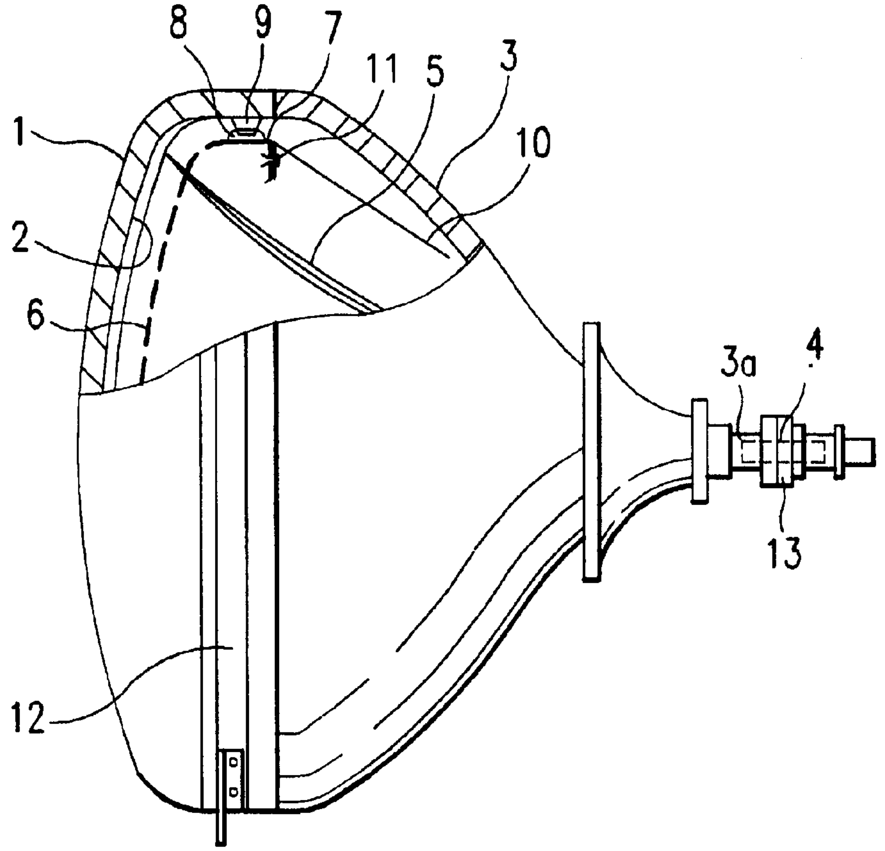
FIG. 1 Related Art
FIG. 1 illustrates a side view of a related art color cathode ray tube, with a partial cut away view.
Figure 2:
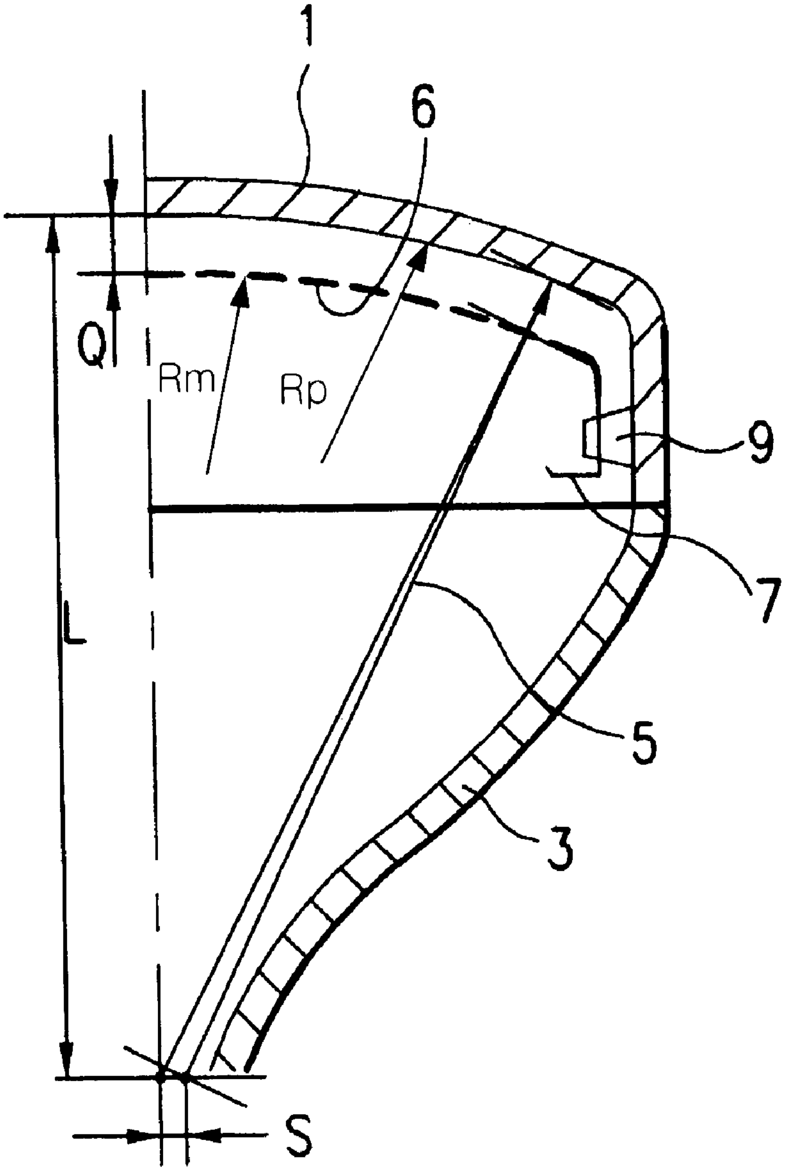
FIG. 2 Related Art
FIG. 2 illustrates a partial section showing an inner structure of a cathode ray tube.
Figure 3:
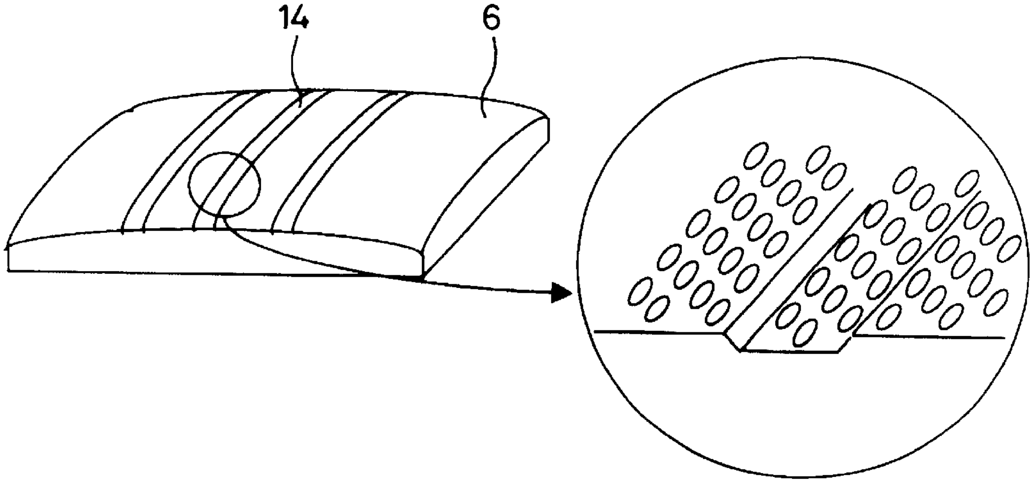
FIG. 3 Related Art
FIG. 3 illustrates a perspective view showing a related art howling prevention structure of a bead application.
Figure 4:
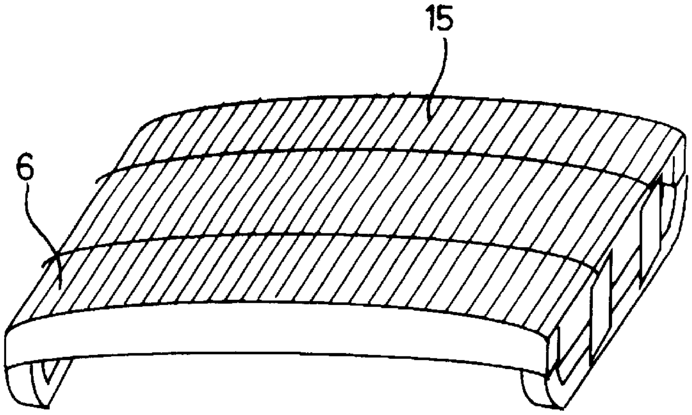
FIG. 4 Related Art
FIG. 4 illustrates a perspective view showing a related art howling prevention structure of a damper wire application to a pre-tensioned shadow mask.
Figure 5:
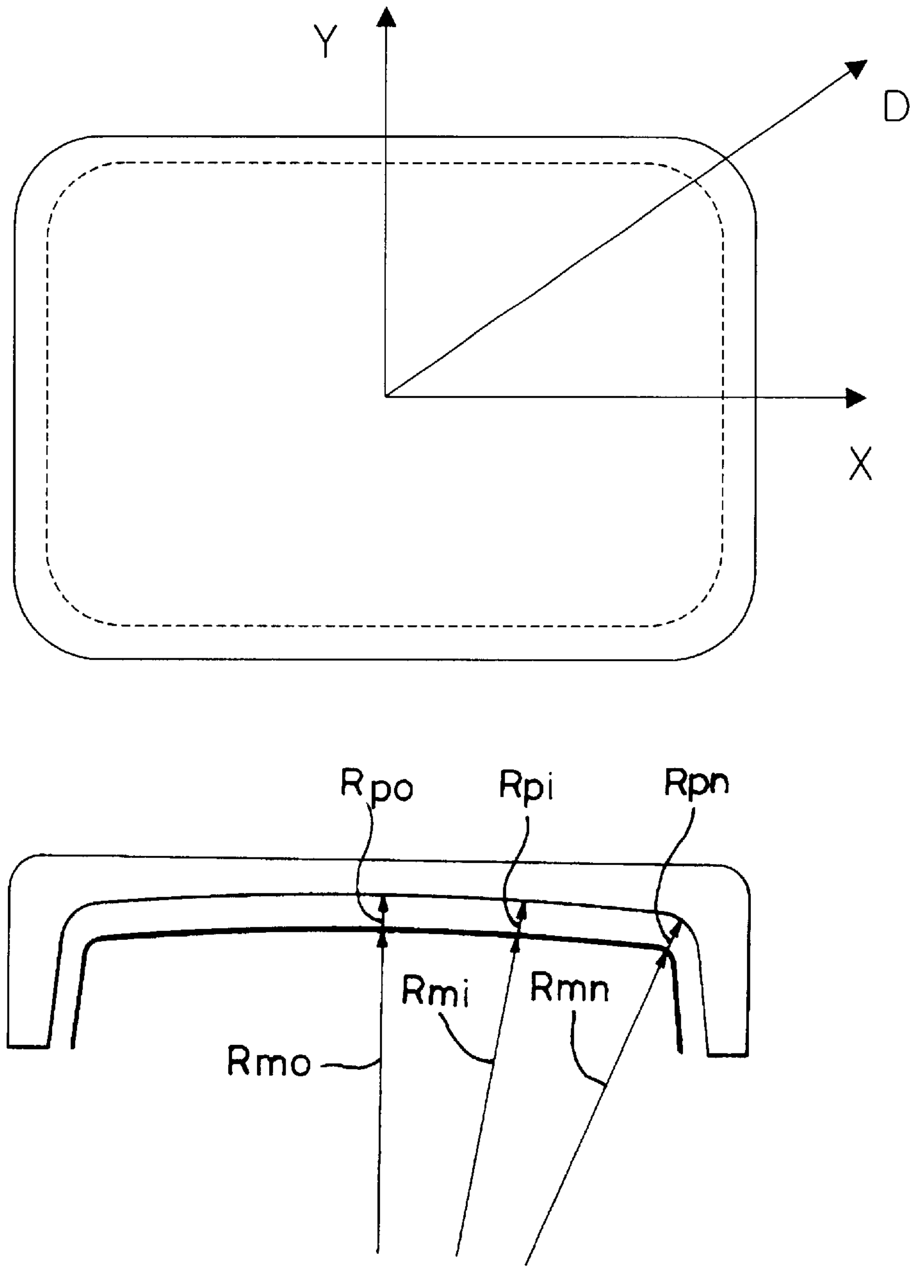
FIG. 5 illustrates curvatures of an inside surface of a panel and a shadow mask, schematically.

Reference will now be made in detail to the preferred embodiments of the present invention, examples of which are illustrated in the accompanying drawings. In explaining embodiments of the present invention, same components will be given the same names and reference symbols, and additional explanations of which will be omitted. FIG. 5 illustrates curvatures of an inside surface of a panel and a shadow mask schematically, referring to which basic curvature structures of an inside surface of a panel and a shadow mask of the present invention will be explained.

Referring to FIG. 5, geometrical structures of the inside surface of the panel and shadow mask can be expressed on two dimensional plane with reference to three axes, i.e., a long axis (X-axis), a short axis (Y-axis), and a diagonal axis (D-axis). Rpo and Rmo respectively denote radiuses of curvatures at the centers of the inside surface of the panel and the shadow mask, Rpi and Rmi respectively denote radiuses of curvatures at points of the inside surface of the panel and a surface of the shadow mask, and Rpn and Rmn respectively denote radiuses of curvatures at ends of the inside surface of the panel and an effective surface of the shadow mask. The Rpo, Rpi, Rpn, Rmo, Rmi, and Rmn are dependent on curvatures at corresponding points of the inside surface of the panel and the shadow mask. Different from the related art color cathode ray tube, the color cathode ray tube of the present invention having the foregoing basic curvature structure employs neither separate strength reinforcement nor howling prevention structure. Instead of this, in order to provide a shadow mask having improved strength and howling characteristics, a panel is used having a curvature structure in which changes of the radius of curvature are continuous within a preset range of ratio applied to an inside surface thereof. Separate from the panel, a shadow mask having the above curvature structure in itself can be applied to the color cathode ray tube of the present invention. Alternatively, the inside surface of the panel and the shadow mask both having the above curvature structures may be used on the same time.

Figure 6:
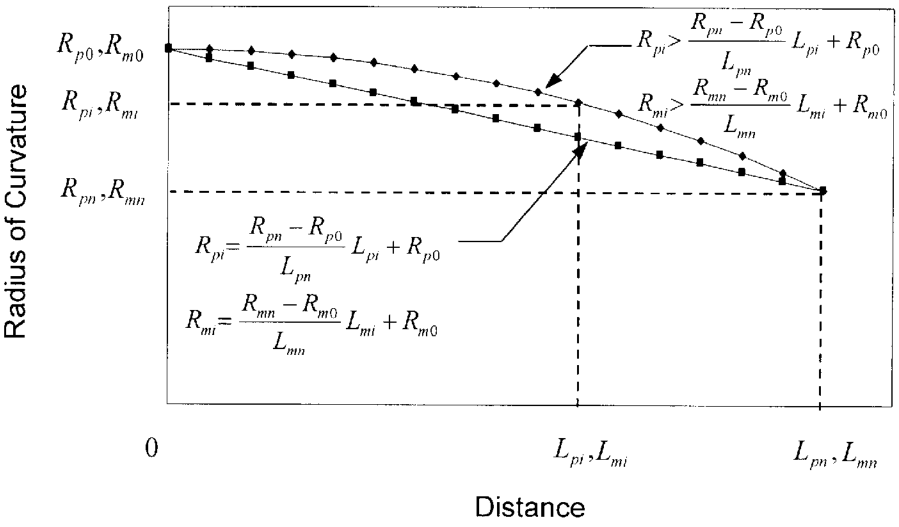
FIG. 6 illustrates a graph showing radii of curvatures vs. distances to an inside surface of the panel and an end of an effective surface of the shadow mask schematically of the present invention.

FIG. 6 illustrates a graph showing radii of curvatures vs. distances to an inside surface of the panel and an end of an effective surface of the shadow mask schematically of the present invention, referring to which the curvature structure of the present invention will be explained.

First, with regard to the inside surface of the panel, the curvature structure of the present invention can be expressed by an equation shown below, where Lpi denotes a distance from a center of curvature of the inside surface of the panel to one point, and Lpn denotes a distance from a center of curvature of the inside surface of the panel to an end of an effective surface.

$$\text{When } Rpi < Rpi-1 \ (i=1, \ldots, n) \tag{1}$$

$$Rpi > \frac{Rpn - Rp0}{Lpn} Lpi + Rp0, \text{ (when } i \neq n \text{ or } 0\text{)},$$

$$\text{if } i=n,\ Rpi=Rpn, \text{ and if } i=0,\ Rpi=Rp\mathbf{0} \tag{2}$$

Referring to FIG. 6, the radius of curvature of the inside surface of the panel is greater than a radius of curvature expressed in a monotone decreasing function of $$Rpi = \frac{Rpn - Rp0}{Lpn} Lpi + Rp0,$$

but gradually decreases within a fixed range of ratio. If the decreasing ratio is represented with a coefficient $\gamma_p$, the following proportional expression (3) can be established.

$$Rpi = \gamma_p Rp\mathbf{0} \tag{3}$$

As the radius of curvature of the inside surface of the panel varies with the distance Lpi, the coefficient $\gamma_p$ can be defined as a function dependent on the Lpi as below.

$$Rpi=\gamma_p(Lpi)Rp0 \quad (4)$$

As the variation of the radius of curvature of the inside surface of the panel shows a continuously decreasing trend according to the variation of the distance Lpi, the proportional function $\gamma_p$ can be expressed as a cosine function of a variable Tpi. Since the variable Tpi is also proportional to the distance Lpi considering a relation between the proportional function $\gamma_p$ and the distance Lpi, the Tpi can be expressed by using a coefficient $\alpha_p$.

$$\gamma_p(Lpi)=\cos(Tpi),\ (Tpi=\alpha_p Lpi) \quad (5)$$

$$\gamma_p(Lpi)=\cos(\alpha_p Lpi)$$

In the meantime, a curvature structure of a shadow mask in accordance with another preferred embodiment of the present invention can be expressed with the following equation, where Lmi denotes a distance from a center of curvature on an inside surface of the panel to one point, and Lmn denotes a distance from the center of curvature on an inside surface of the panel to an end of an effective surface.

$$\text{When } Rmi<Rmi-1\ (i=1, \ldots, n) \quad (6),$$

$$Rmi > \frac{Rmn - Rm0}{Lmn}Lmi + Rm0, \text{ (when } i \neq n \text{ or } 0),$$

$$\text{if } i=n,\ Rmi=Rmn, \text{ and if } i=0,\ Rmi=Rm0 \quad (7).$$

Referring to FIG. 6, alike the curvature of the inside surface of the panel, the radius of curvature of the shadow mask is greater than a radius of curvature expressed in a monotone decreasing function of $$Rmi = \frac{Rmn - Rm0}{Lmn}Lmi + Rm0,$$

but gradually decreases within a fixed range of ratio.

Since process for deriving equations for the shadow mask are the same with the inside surface of the panel, description of the deriving process will be omitted, but resulting equations will be given as follows.

$$Rmi=\gamma_m Rm0 \quad (8)$$

$$Rmi=\gamma_m(Lmi)Rm0 \quad (9)$$

$$\gamma_m(Lmi)=\cos(Tmi),(Tmi=\alpha_m Lmi) \quad (10)$$

$$\gamma_m(Lmi)=\cos(\alpha_m Lmi)$$

With regard to the curvature structures of the inside surface of the panel and the shadow mask, provision of planar periphery which gives little influence to the picture relative to an effective surface is effective for preventing howling of an inner portion of the effective surface. To do this, it is preferable that points $L_{p80\%}$ and $L_{m80\%}$ up to 80% of the distances from centers of the inside surface of the panel and the shadow mask to respective ends of the effective surfaces are set to meet the curvature structures. When the proportional functions $\gamma_p$ and $\gamma_m$ are unity respectively, the inside surface of the panel and the shadow mask are perfect spheres, and when the proportional function $\gamma_p$ of the panel is smaller than 0.75, or the proportional function $\gamma_m$ of the shadow mask is smaller than 0.65, the curvatures at the peripheries very sharply, resulting to greater radiuses of curvatures at central portions. Therefore, it is preferable that the proportional function $\gamma_p$ of the panel at the 80% point $L_{p80\%}$ is in a range of 0.75~0.97, and the proportional function $\gamma_m$ of the shadow mask at the 80% point $L_{m80\%}$ is in a range of 0.65~0.97.

In this instance, the ranges of the proportional functions $\gamma_p$ and $\gamma_m$ at the 80% points $L_{p80\%}$ and $L_{m80\%}$ provide the following ranges of the coefficients $\alpha_p$ and $\alpha_m$ in equations (5) and (10).

$$\frac{\cos^{-1}(0.97)}{L_{p80\%}} \leq \alpha_p \leq \frac{\cos^{-1}(0.75)}{L_{p80\%}} \quad (11)$$

$$\frac{\cos^{-1}(0.97)}{L_{m80\%}} \leq \alpha_m \leq \frac{\cos^{-1}(0.75)}{L_{m80\%}}$$

In addition, for improving strength and howling characteristics, the curvature structures of the inside surface of the panel and the shadow mask of the present invention are preferably set to be true in at least one of the long axis (X-axis), short axis (Y-axis), and diagonal axis (D-axis) of the inside surface of the panel and the shadow mask, and more preferably set to be true in all of the long axis (X-axis), short axis (Y-axis), and diagonal axis (D-axis) of the inside surface of the panel and the shadow mask. Furthermore, it is more preferable that the curvature structures of the inside surface of the panel and the shadow mask of the present invention are set to be true in all directions between the long axis (X-axis), short axis (Y-axis), and diagonal axis(D-axis) of the inside surface of the panel and the shadow mask.

Figure 7:
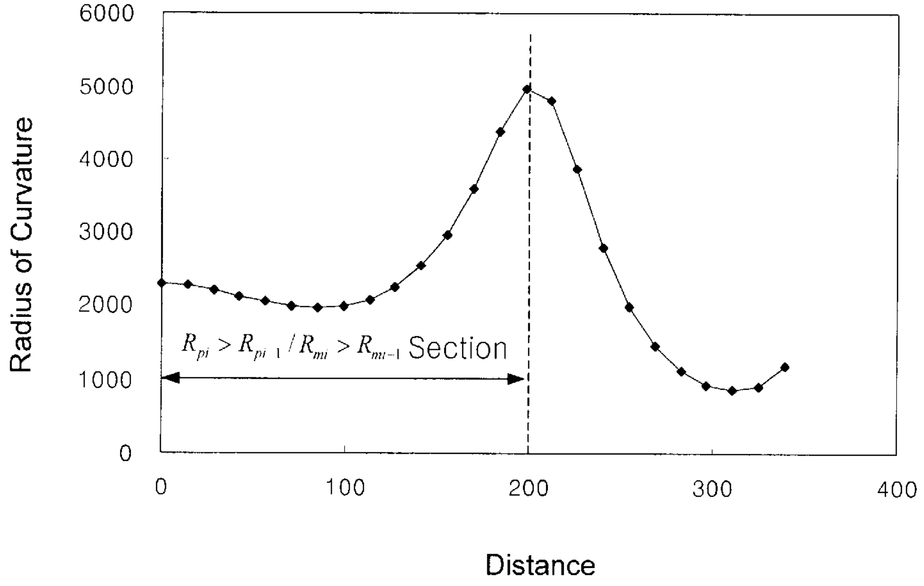
FIG. 7 illustrates a graph showing variation of radius of curvature of a diagonal axis (D axis) as a comparative example of the present invention.
Figure 8A:
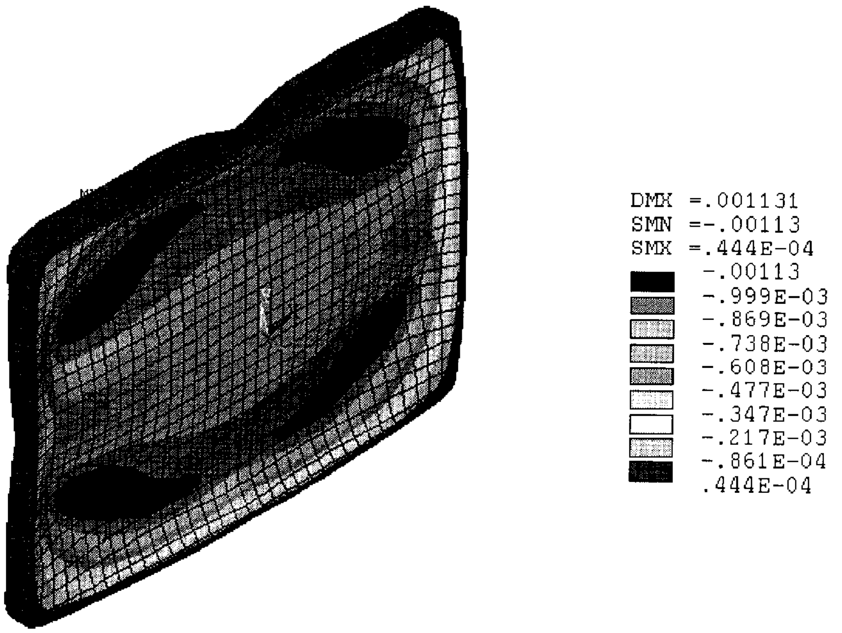
FIGS. 8A and 8B illustrate results of finite element analyses of a shadow mask as a comparative example of the present invention.
Figure 8B:
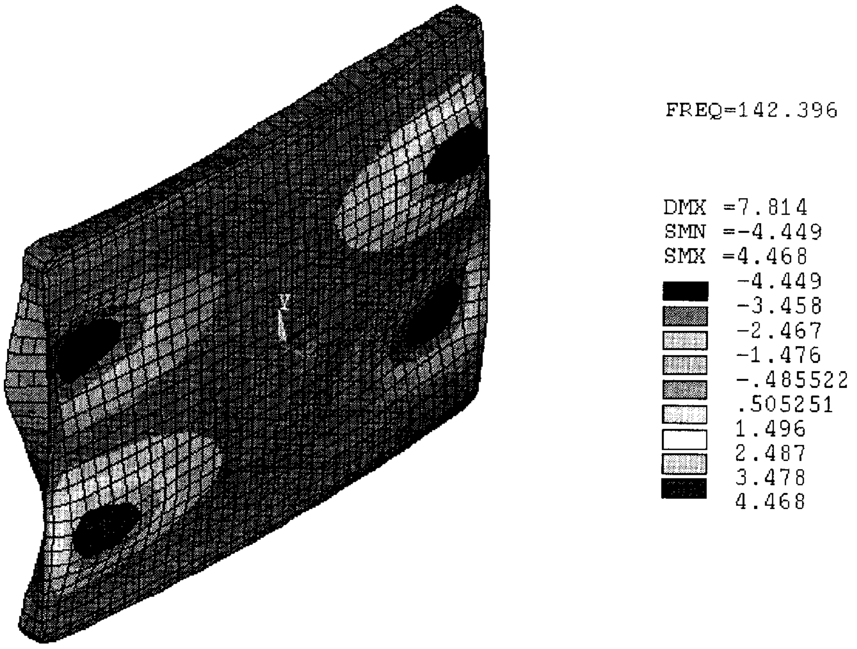

In the meantime, for more detailed understanding of the present invention, the present invention will be explained, taking opposite cases to the present invention as comparative examples. FIG. 7 illustrates a graph showing variation of radius of curvature of a diagonal axis (D axis) as a comparative example of the present invention, when a curvature structure of Rpi>Rpi−1, and Rmi>Rmi−1 are applied thereto, and FIGS. 8A and 8B illustrate results of finite element analyses of a shadow mask which has the above curvature structure as a comparative example of the present invention.

Referring to FIG. 7, if the inside surface of the panel has a region of Rpi>Rpi−1, which is flatter than surrounding region, the curvature structure of the shadow mask will also have a region of Rmi>Rmi−1. Consequently, the region of the shadow mask, not only has a poor strength, but also is susceptible to vibration. This result can be verified from a finite element analyses of a shadow mask modeled to include the Rmi>Rmi−1 region. FIG. 8A illustrates an analysis of deformation of the shadow mask when a pressure is applied to all over the surface of the shadow mask. As deformation in the flat region is great relative to the peripheral region, it can be known from FIG. 8A that a structural strength of the flat region is poor. Alikely, it can be known from FIG. 8B which illustrates an analysis of natural frequency of the shadow mask that there is vibration occurred in the flat region. Accordingly, an external vibration causes the electron beams passing through the shadow mask to change the path, which in turn causes howling in which a shadow of the picture changes periodically, that gives inconvenience to the user.

Figure 9:
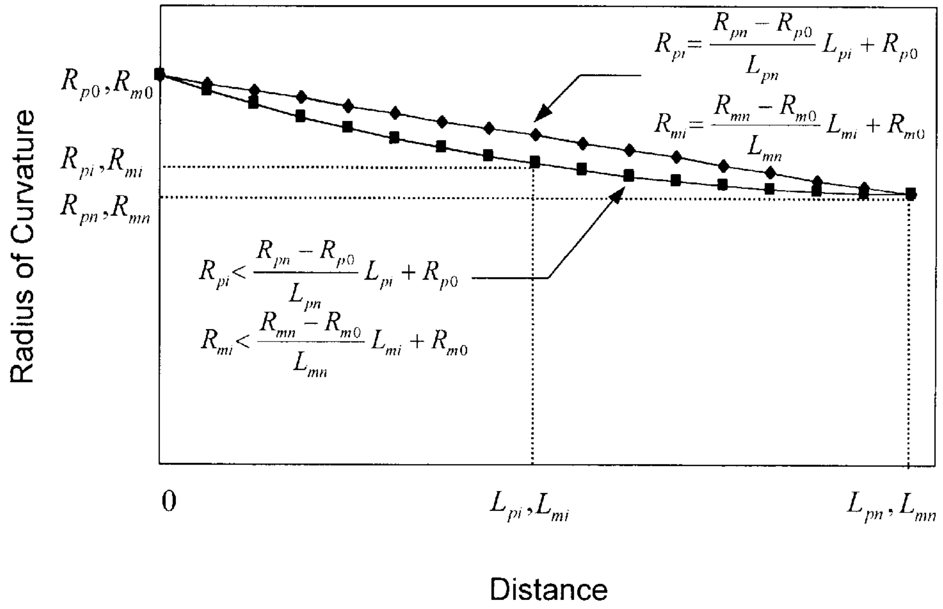
FIG. 9 illustrates a graph showing radii of curvatures vs. distances to an end of an effective surface of an inside surface of the panel and the shadow mask for respective axes schematically as a comparative example of the present invention.

As another comparative example, a curvature structure which can be expressed by the following equation (12) opposite to the equations (2) and (7) of the present invention can be assumed. FIG. 9 illustrates a graph showing radii of curvatures vs. distances to an end of an effective surface of an inside surface of the panel and the shadow mask for respective axes schematically as a comparative example of the present invention.

$$Rpi < \frac{Rpn - Rp0}{Lpn} Lpi + Rp0 \qquad (12)$$

$$Rmi < \frac{Rmn - Rm0}{Lmn} Lmi + Rm0$$

Figure 10A:
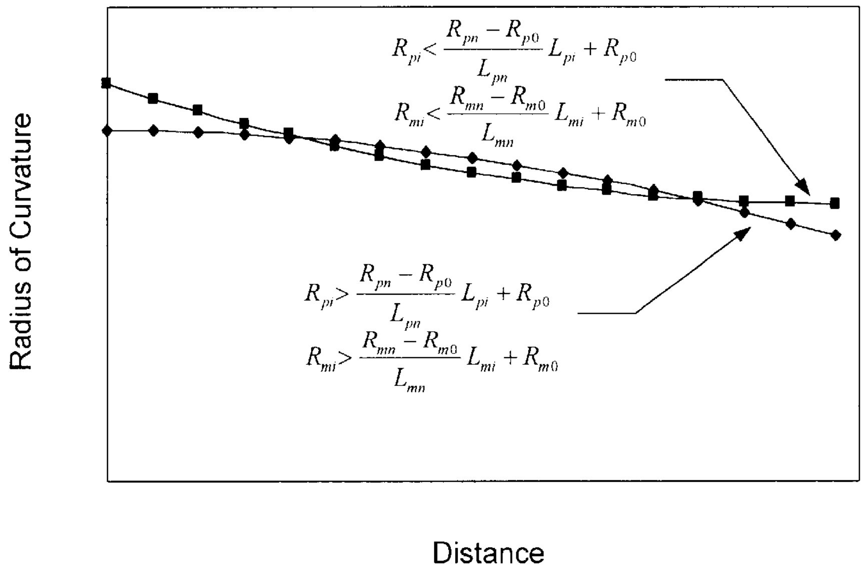
FIGS. 10A and 10B illustrate graphs showing comparisons of the present invention and a comparative example with respect to radius of curvatures and center heights versus distance respectively.

Though the curvature structures having the equation (12) applied thereto are favorable to doming, thermal expansion characteristics of the shadow mask, the curvature structures show sharp decreases of radiuses of curvatures of the inside surface of the panel and the shadow mask at centers of central portions thereof respectively, which can be verified by comparing variations of radiuses of curvatures of the present invention and the comparative example. FIG. 10A illustrates a graph showing a difference of curvature changes between the present invention and the comparative example when the same Q value is applied thereto.

Figure 10B:
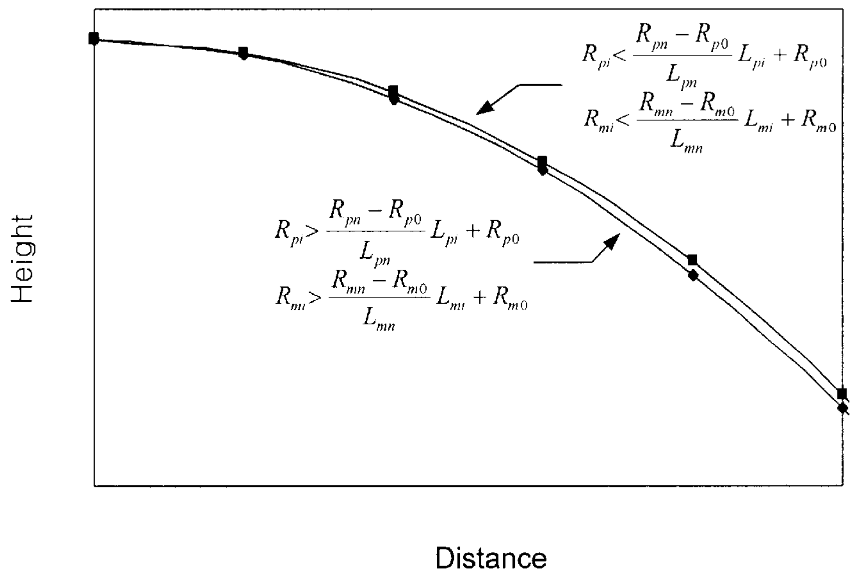

Referring to FIG. 10A, when it is assumed that the Q values, distances between the inside surface of the panel and the shadow mask, are made the same owing to the electron beam grouping rate characteristics, the curvatures of the inside surface of the panel and the shadow mask increase at center portions thereof in the case of the comparative example, which is apparent also in FIG. 10B illustrating a graph showing a comparison of heights at the center portions of the inside surface of the panel and the shadow mask of the present invention and the comparative example. If Q value is the same, the shadow mask having the curvature of the equation (12) is applied thereto has a relatively flat center portion, with a reduced strength, the shadow mask is susceptible to deformation during fabrication or when an external impact is applied. Therefore, it can be known that the curvature structure of the present invention is more favorable than the comparative examples for preventing strength deterioration and howling.

Figure 11A:
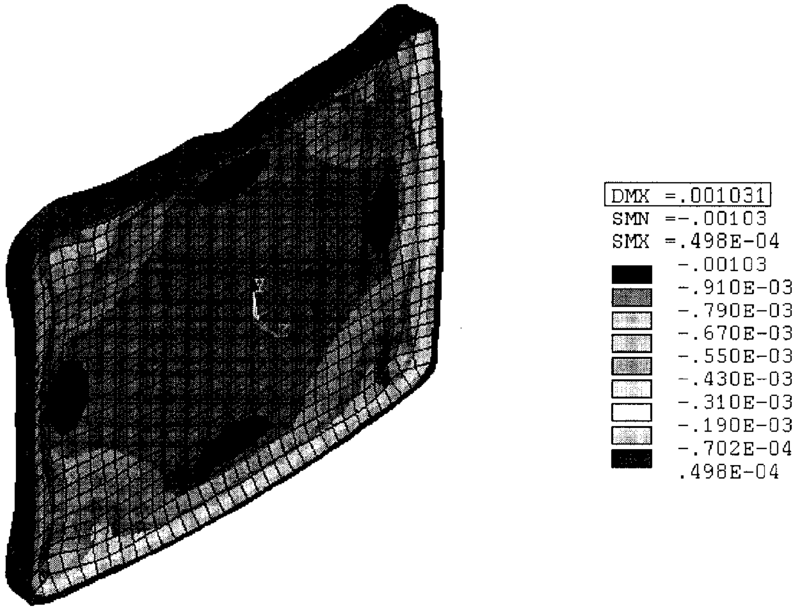
FIGS. 11A and 11B illustrate results of structural analyses of a shadow mask of the present invention and a related art shadow mask with respect to a pressure.
Figure 11B:
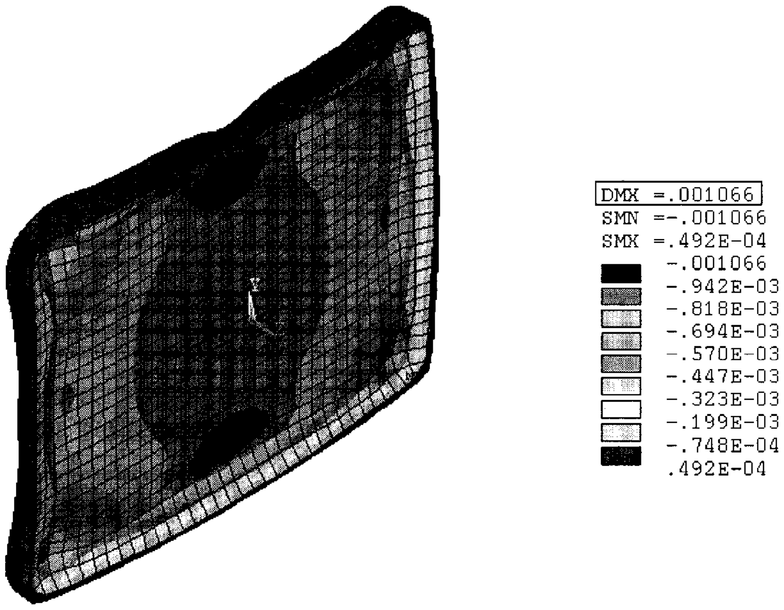

Along with this, for showing the effectiveness of the present invention more clearly, structures of the shadow mask of the present invention and a shadow mask having a curvature of sphere substantially are analyzed and compared as follows. FIGS. 11A and 11B illustrate results of structural analyses of a shadow mask of the present invention and a related art shadow mask when a pressure is applied to surfaces thereof, respectively.

As the spherical shadow mask in FIG. 8A has a maximum deformation of 0.001031 and the shadow mask of the present invention in FIG. 8B has a maximum deformation of 0.001066, it can be known that the spherical shadow mask has relatively less deformation, which can be interpreted that this is because the sphere has a better rigidity to a vertical load in view of structure. However, as the difference of deformation is marginal, it may be taken that the shadow mask of the present invention has a strength close to the spherical shadow mask which is stable in view of structure.

Figure 12A:
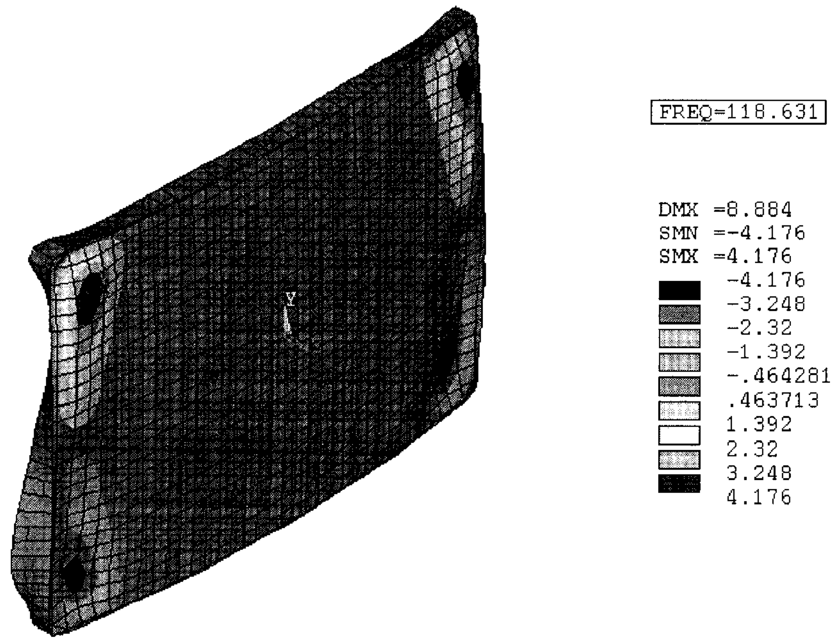
FIGS. 12A and 12B illustrate results of structural analyses of shadow masks of the present invention and a related art with respect to natural vibration modes; and, FIGS. 13A and 13B illustrate results of structural analyses of shadow masks of the present invention and a related art with respect to natural vibration modes.
Figure 12B:
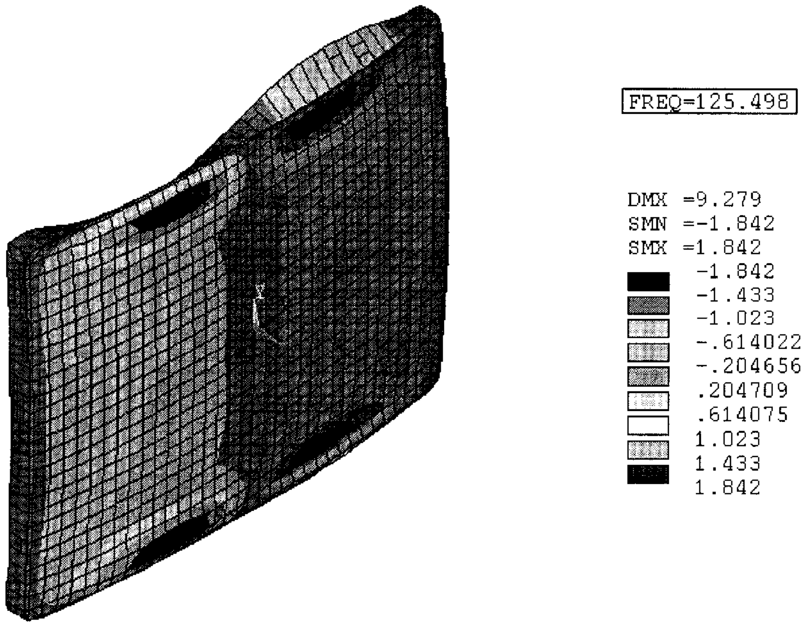
Figure 13A:
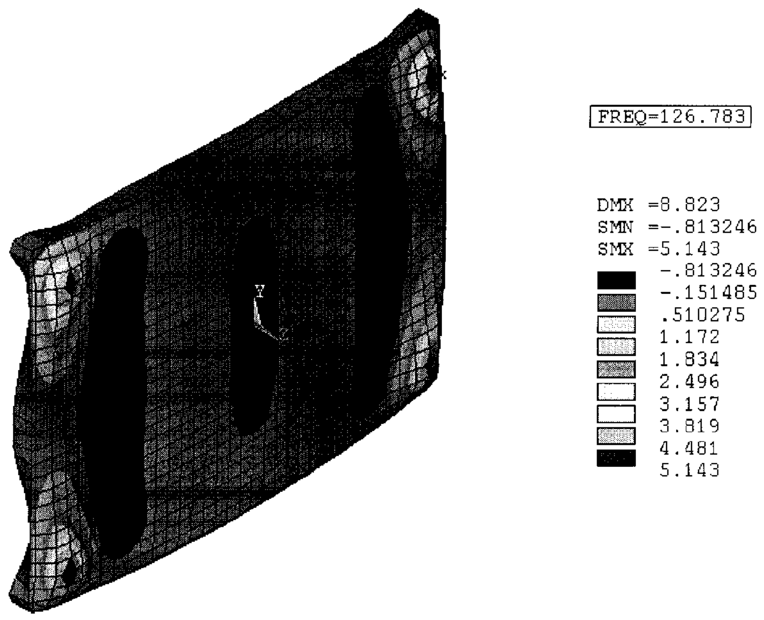
Figure 13B:
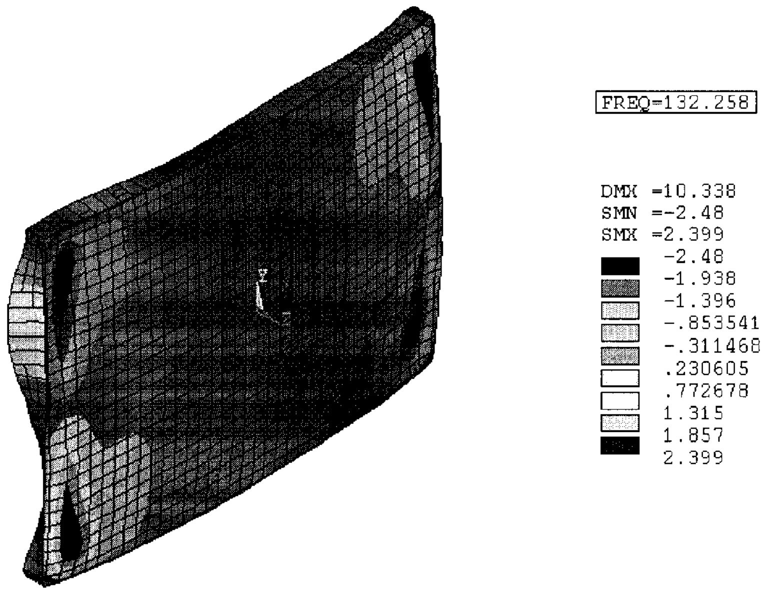

FIGS. 12A, 12B, 13A and 13B illustrate results of structural analyses of shadow masks of the present invention and a related art with respect to natural vibration modes, wherefrom frequencies and distributions of resonances caused by an external frequency can be known for respective curvature structures. FIGS. 12A and 12B illustrate results of natural frequency analyses for a first mode, and FIGS. 13A and 13B illustrate results of natural frequency analyses for the most unfavorable mode with respect to howling among total ten times of mode analyses.

Different from results of the analyses of deformation by pressure, it is turned out from the natural vibration mode analyses that the spherical shadow mask has a relatively low natural frequency, which is unfavorable to the howling, on the contrary. That is, while the shadow mask of the present invention shown in FIGS. 12B and 13B have natural frequencies of 125.498 Hz and 132.258 Hz, the spherical shadow mask shown in FIGS. 12A and 13A have natural frequencies of 118.631 Hz and 126.783 Hz, that is substantially low. In other words, the spherical shadow mask shows howling at a substantially low frequency band, which is poor relative to the shadow mask of the present invention.

The howling distributions are represented as deformation distribution caused by vibration in FIGS. 12A, 12B, 13A and 13B. As shown in FIG. 12A, the spherical shadow mask has small howling areas for the first mode at ends of the effective surface. However, as shown in FIG. 13A, the spherical shadow mask has a substantially greater vibration deformation, i.e., a howling amplitude, all over the effective area of the shadow mask enough to deteriorate a picture quality. Opposite to this, as shown in FIGS. 12B and 13B, the shadow mask of the present invention has howling amplitudes all of which are small at ends of the effective surface, that gives little influence in an actual picture.

As has been explained, the color cathode ray tube of the present invention has the following advantages.

By using an inside surface of panel or a shadow mask separately or together, radiuses of curvatures of both of which vary continuously within certain ranges, the present invention can improve a structural strength and howling characteristics of a shadow mask, permitting to minimize deformation of the shadow mask even if there is an external force applied thereto, and prevent deterioration of a color reproducibility caused by impact or speaker sound during operation of the cathode ray tube.

It will be apparent to those skilled in the art that various modifications and variations can be made in the color cathode ray tube of the present invention without departing from the spirit or scope of the invention. Thus, it is intended that the present invention cover the modifications and variations of this invention provided they come within the scope of the appended claims and their equivalents.

What is claimed is:

1. A color cathode ray tube comprising:

a panel in front portion of the cathode ray tube; and, a shadow mask spaced from, and fitted to rear of the panel for selecting a color from electron beams, wherein an inside surface of the panel has a curvature structure in which a radius of curvature varies continuously within a fixed ratio range according to the following equation, $$Rpi < Rpi-1 \ (i=1, \ldots, n)$$

$$Rpi > \frac{Rpn - Rp0}{Lpn} Lpi + Rp0, \text{ (when } i \neq n \text{ or } 0),$$

if i=n, Rpi=Rpn, and if i=0, Rpi=Rp0, where,

Rp0 denotes a radius of curvature at a center of the inside surface of the panel, Rpi denotes a radius of curvature at any location on the inside surface of the panel, Rpn denotes a radius of curvature at an end of effective surface on the inside surface of the panel, Lpi denotes a distance from a center of the inside surface of the panel to any location on the inside surface of the panel, and Lpn denotes a distance from a center of the inside surface of the panel to an end of an effective surface.

2. A color cathode ray tube as claimed in claim 1, wherein the curvature structure of the inside surface of the panel can be expressed as Rpi=$\gamma_p$Rp0, where the $\gamma_p$ denotes a coefficient variable within a range.

3. A color cathode ray tube as claimed in claim 2, wherein the curvature structure of the inside surface of the panel can be expressed as Rpi=$\gamma_p$(Lpi)Rp0, where the $\gamma_p$ denotes a function dependent on a distance Lpi.

4. A color cathode ray tube as claimed in claim 3, wherein the proportional function $\gamma_p$(Lpi) is a continuously decreasing function with respect to a variable Tpi which is proportional to the distance Lpi according to a coefficient $\alpha_p$, to establish the following equation, $$\gamma_p(Lpi)=\cos(Tpi),\ (Tpi=\alpha_p Lpi),$$

$$\gamma_p(Lpi)=\cos(\alpha_p Lpi).$$

5. A color cathode ray tube as claimed in claim 1, wherein the curvature structure is formed up to a point $L_{p80\%}$ 80% of a distance from the center of the inside surface of the panel to the end of the effective surface, for improving howling.

6. A color cathode ray tube as claimed in claim 5, wherein the proportional function $\gamma_p$ has a value in a range of 0.75~0.97 at the 80% point $L_{p80\%}$.

7. A color cathode ray tube as claimed in claim 6, wherein the coefficient $\alpha_p$ has a value expressed by the following inequality depending on a range of a value of the proportional function $\gamma_p$ at the 80% point $L_{p80\%}$, $$\frac{\cos^{-1}(0.97)}{L_{p80\%}} \le \alpha_p \le \frac{\cos^{-1}(0.75)}{L_{p80\%}}$$

8. A color cathode ray tube as claimed in claim 1, wherein the curvature structure is true in at least one of a long axis(X-axis), a short axis(Y-axis), and a diagonal axis(D-axis).

9. A color cathode ray tube as claimed in claim 8, wherein the curvature structure is true in all of a long axis(X-axis), a short axis(Y-axis), and a diagonal axis(D-axis).

10. A color cathode ray tube as claimed in claim 9, wherein the curvature structure is true in all directions contained between the long axis(X-axis), the short axis(Y-axis), and the diagonal axis(D-axis).

11. A color cathode ray tube comprising:

a panel in front portion of the cathode ray tube; and, a shadow mask spaced from, and fitted to rear of the panel for selecting a color from electron beams, wherein the shadow mask has a curvature structure in which a radius of curvature varies continuously within a fixed ratio range according to the following equation, $$Rmi<Rmi-1\ (i=1, \ldots, n)$$

$$Rmi > \frac{Rmn - Rm0}{Lmn} Lmi + Rm0, \text{(when } i \neq n \text{ or } 0),$$

if i=n, Rmi=Rmn, and if i=0, Rmi=Rm0, where,

Rm0 denotes a radius of curvature at a center of the shadow mask,

Rmi denotes a radius of curvature at any location on the shadow mask,

Rmn denotes a radius of curvature at an end of effective surface on the shadow mask, Lmi denotes a distance from a center of the shadow mask to any location on the shadow mask, and Lmn denotes a distance from a center of the shadow mask to an end of an effective surface.

12. A color cathode ray tube as claimed in claim 11, wherein the curvature structure of the shadow mask can be expressed as Rmi=$\gamma_m$Rm0, where the $\gamma_m$ denotes a coefficient variable within a range.

13. A color cathode ray tube as claimed in claim 12, wherein the curvature structure of the shadow mask can be expressed as Rmi=$\gamma_m$(Lmi)Rm0, where the $\gamma_m$ denotes a function dependent on a distance Lmi.

14. A color cathode ray tube as claimed in claim 13, wherein the proportional function $\gamma_m$(Lmi) is a continuously decreasing function with respect to a variable Tmi which is proportional to the distance Lmi according to a coefficient $\alpha_m$, to establish the following equation, $$\gamma_m(Lmi)=\cos(Tmi),\ (Tmi=\alpha_m Lmi),$$

$$\gamma_m(Lmi)=\cos(\alpha_m Lmi).$$

15. A color cathode ray tube as claimed in claim 11, wherein the curvature structure is formed up to a point $L_{m80\%}$ 80% of a distance from the center of the shadow mask to the end of the effective surface, for improving howling.

16. A color cathode ray tube as claimed in claim 15, wherein the proportional function $\gamma_m$ has a value in a range of 0.65~0.97 at the 80% point $L_{m80\%}$.

17. A color cathode ray tube as claimed in claim 16, wherein the coefficient $\alpha_m$ has a value expressed by the following inequality depending on a range of a value of the proportional function $\gamma_m$ at the 80% point $L_{m80\%}$.

$$\frac{\cos^{-1}(0.97)}{L_{m80\%}} \le \alpha_m \le \frac{\cos^{-1}(0.65)}{L_{m80\%}}.$$

18. A color cathode ray tube as claimed in claim 11, wherein the curvature structure is true in at least one of a long axis(X-axis), a short axis(Y-axis), and a diagonal axis(D-axis).

19. A color cathode ray tube as claimed in claim 18, wherein the curvature structure is true in all of a long axis(X-axis), a short axis(Y-axis), and a diagonal axis(D-axis).

20. A color cathode ray tube as claimed in claim 19, wherein the curvature structure is true in all directions contained between the long axis(X-axis), the short axis(Y-axis), and the diagonal axis(D-axis).

21. A color cathode ray tube comprising:

a panel in front portion of the cathode ray tube; and, a shadow mask spaced from, and fitted to rear of the panel for selecting a color from electron beams, wherein both an inside surface of the panel and the shadow mask have curvature structures in each of which radius of curvature varies continuously within a fixed ratio range according to the following equations, $$Rpi<Rpi-1\ (i=1, \ldots, n)$$

$$Rpi > \frac{Rpn - Rp0}{Lpn} Lpi + Rp0, \text{(when } i \neq n \text{ or } 0),$$

if i=n, Rpi=Rpn, and if i=0, Rpi=Rp0, and

Rmi<Rmi=1 (i=1, . . . , n)

$$Rmi > \frac{Rmn - Rm0}{Lmn} Lmi + Rm0, \text{ (when } i \neq n \text{ or 0)},$$

if i=n, Rmi=Rmn, and if i=0, Rmi=Rm0.

22. A color cathode ray tube as claimed in claim 21, wherein the curvature structures of the inside surface of the panel and the shadow mask can be expressed as Rpi=$\gamma_p$Rp0 and Rmi=$\gamma_m$Rm0 respectively, where the $\gamma_p$ and $\gamma_m$ denote coefficients each variable within a range.

23. A color cathode ray tube as claimed in claim 22, wherein the curvature structure of the inside surface of the panel and the shadow mask can be expressed as Rpi=$\gamma_p$(Lpi) Rp0 and Rmi=$\gamma_m$(Lmi)Rm0 respectively, where the $\gamma_p$ and $\gamma_m$ denote functions dependent on distances Lpi and Lmi, respectively.

24. A color cathode ray tube as claimed in claim 23, wherein the proportional functions $\gamma_p$(Lpi) and $\gamma_m$(Lmi) are continuously decreasing functions with respect to variables Tpi and Tmi which are proportional to the distances Lpi and Lmi according to coefficients $\alpha_p$ and $\alpha_m$ to establish the following equations, respectively, $$\gamma_p(Lpi)=\cos(Tpi),\ (Tpi=\alpha_p Lpi),$$

$$\gamma_p(Lpi)=\cos(\alpha_p Lpi), \text{ and}$$

$$\gamma_m(Lmi)=\cos(Tmi),\ (Tmi=\alpha_m Lmi),$$

$$\gamma_m(Lmi)=\cos(\alpha_m Lmi).$$

25. A color cathode ray tube as claimed in claim 21, wherein the curvature structures are formed up to points $L_{p80\%}$ and $L_{m80\%}$ 80% of distances from the centers of the inside surface of the panel and the shadow mask to the ends of the effective surfaces respectively, for improving howling.

26. A color cathode ray tube as claimed in claim 25, wherein the proportional functions $\gamma_p$ and $\gamma_m$ have values in ranges of 0.75~0.97 and 0.65~0.97 at the 80% points $L_{p80\%}$ and $L_{m80\%}$, respectively.

27. A color cathode ray tube as claimed in claim 26, wherein the coefficients $\alpha_p$ and $\alpha_m$ have values expressed by the following inequalities depending on ranges of values of the proportional functions $\gamma_p$ and $\gamma_m$ at the 80% points $L_{p80\%}$ and $L_{m80\%}$, respectively, $$\frac{\cos^{-1}(0.97)}{L_{m80\%}} <= \alpha_m <= \frac{\cos^{-1}(0.75)}{L_{m80\%}}$$

$$\frac{\cos^{-1}(0.97)}{L_{p80\%}} <= \alpha_p <= \frac{\cos^{-1}(0.75)}{L_{p80\%}}.$$

28. A color cathode ray tube as claimed in claims 21 to 27, wherein the curvature structures are true in at least one of a long axis(X-axis), a short axis(Y-axis), and a diagonal axis(D-axis), respectively.

29. A color cathode ray tube as claimed in claim 28, wherein the curvature structures are true in all of a long axis(X-axis), a short axis(Y-axis), and a diagonal axis(D-axis), respectively.

30. A color cathode ray tube as claimed in claim 29, wherein the curvature structures are true in all directions contained between the long axis(X-axis), the short axis(Y-axis), and the diagonal axis(D-axis).

* * * * *